US008178071B2

(12) United States Patent
Mizuno et al.

(10) Patent No.: US 8,178,071 B2
(45) Date of Patent: May 15, 2012

(54) METAL OXIDE NANOPARTICLES, PRODUCTION METHOD THEREOF, LIGHT-EMITTING ELEMENT ASSEMBLY, AND OPTICAL MATERIAL

(75) Inventors: Mikihisa Mizuno, Miyagi (JP); Yuichi Sasaki, Miyagi (JP); Sung-kil Lee, Miyagi (JP); Hitoshi Katakura, Miyagi (JP)

(73) Assignee: Sony Corporation, Tokyo ( * ) Notice: Subject to any disclaimer, the term of this patent is extended or adjusted under 35 U.S.C. 154(b) by 895 days.

(21) Appl. No.: 11/744,071

(22) Filed: May 3, 2007

(65) Prior Publication Data

US 2007/0264492 A1   Nov. 15, 2007

(30) Foreign Application Priority Data

May 10, 2006  (JP) ................................. P2006-131671

(51) Int. Cl.
*C01B 13/00* (2006.01)
*C01C 1/00* (2006.01)
*C01D 1/02* (2006.01)
*C01G 23/00* (2006.01)
*C01G 17/02* (2006.01)
*C01G 19/02* (2006.01)
*C01G 21/02* (2006.01)

(52) U.S. Cl. .................. 423/593.1; 423/598; 423/594.9; 977/773; 977/776

(58) Field of Classification Search .................. 313/506; 427/212; 423/598, 594.9, 608, 618, 593.1; 502/349, 350, 352; 977/773, 775–777, 811
See application file for complete search history.

(56) References Cited

U.S. PATENT DOCUMENTS

| 4,448,898 | A  | * | 5/1984  | Sun .............................. 502/350 |
| 5,720,805 | A  | * | 2/1998  | Wellinghoff et al. .......... 106/441 |
| 7,118,727 | B2 | * | 10/2006 | Williams ................... 423/592.1 |
| 7,169,375 | B2 | * | 1/2007  | Chisholm ................. 423/592.1 |
| 7,232,556 | B2 | * | 6/2007  | Yadav ........................ 423/592.1 |
| 2003/0032679 | A1 | * | 2/2003 | Cayton et al. ................... 516/33 |
| 2004/0247503 | A1 |   | 12/2004 | Hyeon |
| 2005/0063898 | A1 | * | 3/2005 | Ja Chisholm ................ 423/608 |

(Continued)

FOREIGN PATENT DOCUMENTS

JP   4-27168   5/1992

(Continued)

OTHER PUBLICATIONS

Lin et al. "Photocatalytic Activity of Rutile Ti1-xSnxO2 Solid Solutions", Journal of Catalysis 183, 368-372 (1999).*

(Continued)

*Primary Examiner* — Steven Bos
*Assistant Examiner* — Anthony J Zimmer
(74) *Attorney, Agent, or Firm* — K&L Gates LLP

(57) ABSTRACT

Metal oxide nanoparticles, production method thereof, light-emitting element assembly, and an optical material are provided. A method of producing metal oxide nanoparticles includes the steps of (A) mixing a first metal alkoxide containing a first metal, a second metal alkoxide containing a second metal different from the first metal, and a surfactant under an inert atmosphere to prepare a reaction solution; and (B) mixing a reaction initiator prepared by mixing a catalyst with a solvent and the reaction solution, and then heating the mixture of the reaction initiator and the reaction solution under an inert atmosphere to produce metal oxide nanoparticles which have a rutile-type crystal structure based on an atom of the first metal, an atom of the second metal, and an oxygen atom, and the surfaces of which are coated with the surfactant.

9 Claims, 4 Drawing Sheets

U.S. PATENT DOCUMENTS

| | | | |
|---|---|---|---|
| 2005/0191492 A1* | 9/2005 | Yadav | 428/407 |
| 2005/0233146 A1 | 10/2005 | Nonninger | |
| 2006/0135669 A1* | 6/2006 | Ryang | 524/430 |
| 2007/0202334 A1* | 8/2007 | Xie et al. | 428/402 |

FOREIGN PATENT DOCUMENTS

| | | |
|---|---|---|
| JP | 2783417 | 5/1998 |
| JP | 2001-192582 | 7/2001 |
| JP | 2004-140352 | 5/2004 |
| JP | 2005-504888 | 2/2005 |
| JP | 2005-075723 | 3/2005 |
| JP | 2005-132706 | 5/2005 |
| JP | 2005-519756 | 7/2005 |
| JP | 2005-528309 | 9/2005 |
| JP | 2005-272244 | 10/2005 |
| WO | WO 03031323 A1 * | 4/2003 |

OTHER PUBLICATIONS

Toupance et al. "Nanocrystalline Mesoporous Tin Dioxide Prepared by the Sol-Gel Route from a Dialkoxyki(Beta-Diketonato)tin Complex", Chemistry of Materials 2003, 15, 4691-4697.*

Zakrzewska, K. "Mixed oxides as gas sensors", Thin Solid Films 391 (2001) 229-238.*

Niederberger et al. "Non-aqueous routes to crystalline metal oxide nanoparticles: Formation mechanisms and applications", Progress in Solid State Chemistry 33 (2005) 59-70.*

Cushing et al. "Recent Advances in the Liquid-Phase Syntheses of Inorganic Nanoparticles" Chem. Rev. 2004, 104, 3893-3946.*

Cozzoli et al., Low-Temperature Synthesis of Soluble and Processable Organic-Capped Anatase TiO2 Nanorods, J. Am. Chem. 2003, 125, pp. 14539-14548.

Zhang et al., "Thermodynamic analysis of phase stability of nanocrystalline titania," J. Mate. Chem., 8(9), pp. 2073-2076.

Lin et al., "Photocatalytic Activity of Rutile Ti1-xSnxO2 Solid Solutions", Journal of Catalysis, 1999, pp. 368-372.

Toupance et al., "Nanocrystalline Mesoporous Tin Dioxide Prepared by the Sol-Gel Route from a Dialkoxydi(β-Diketonato)tin Complex", Chem. Mater., 2003, vol. 15, pp. 4691-4697.

* cited by examiner

METAL OXIDE NANOPARTICLES, PRODUCTION METHOD THEREOF, LIGHT-EMITTING ELEMENT ASSEMBLY, AND OPTICAL MATERIAL

CROSS REFERENCES TO RELATED APPLICATIONS

The present application claims priority to Japanese Patent Application JP 2006-131671 filed in the Japanese Patent Office on May 10, 2006, the entire disclosure of which are incorporated herein by reference.

BACKGROUND

The present application relates to metal oxide nanoparticles, a production method thereof, and a light-emitting element assembly and an optical material that include the metal oxide nanoparticles.

In nanoparticle-resin composite materials prepared by adding nanoparticles of a metal oxide such as titanium oxide to a polymer, their refractive indices can be controlled to be higher than the refractive index $n_m$ of the polymer alone. Therefore, such metal oxide nanoparticles serving as an additive for a polymer are useful for designing and producing various optical materials. Examples of optical products in which an increase in refractive index is effective include optical lenses, light control films, Fresnel lenses, antireflective coatings, optical discs, diffusion films, and holographic substrates.

In the metal oxide nanoparticles used in such applications, it is important that the transparency and other optical properties of the nanoparticle-resin composite materials prepared by combining a polymer are not degraded. When the refractive index $n_p$ of the metal oxide nanoparticles and the refractive index $n_m$ of the polymer are different from each other, the transparency of the nanoparticle-resin composite material in which the optical path length is, for example, on the millimeter order markedly depends on the particle diameter of the metal oxide nanoparticles and the dispersibility of the metal oxide nanoparticles in the polymer. When the metal oxide nanoparticles have a large particle diameter, the transparency of the nanoparticle-resin composite material is decreased because the metal oxide nanoparticles scatter light. When the dispersibility of the metal oxide nanoparticles is not satisfactory, the transparency of the nanoparticle-resin composite material is markedly decreased because the metal oxide nanoparticles are agglomerated, and the agglomerated metal oxide nanoparticles strongly scatter or reflect light.

A method of synthesizing titanium oxide nanoparticles, the surfaces of which are coated with a surfactant, is disclosed in, for example, P. D. Cozzoli, A. Kornowski, and H. Weller; J. Am. Chem. Soc. 2003, 125, 14539 (hereinafter referred to as Document 1). The surfactant on the surfaces of the nanoparticles stabilizes the dispersion of the titanium oxide nanoparticles to prevent agglomeration thereof. Therefore, it is believed that such a surfactant is also effective for stabilizing the dispersion of the titanium oxide nanoparticles in a polymer.

Typical crystal structures of titanium oxide include rutile and anatase. Rutile-type titanium oxide has a refractive index higher than that of anatase-type titanium oxide and has excellent light resistance. Accordingly, from the standpoint of high refractive index, titanium oxide nanoparticles used in a nanoparticle-resin composite material are preferably composed of rutile-type titanium oxide. The thermodynamically stabilized phase of bulk titanium oxide is rutile-type titanium oxide at room temperature and at atmospheric pressure. However, when the particle diameter is 10 nm or less, the specific surface area of the particles significantly increases, and anatase-type titanium oxide becomes the stabilized phase (see H. Zhang and J. F. Banfield; J. Mater. Chem. 1998, 8, 2073 (hereinafter referred to as Document 2)).

It is known that even when the particle diameter is 10 nm or less, rutile-type titanium oxide can be obtained by doping tin with titanium oxide. For example, according to Japanese Examined Patent Application Publication No. 4-27168, rutile-type $Ti_xSn_{1-x}O_2$ nanoparticles having a particle diameter of 10 nm or less can be produced by a hydrothermal treatment of a mixed gel of a titanium compound and a tin compound. Furthermore, Japanese Patent No. 2783417 discloses a method of producing rutile-type $Ti_xSn_{1-x}O_2$ nanoparticles having a particle diameter of 10 nm or less in which hydrous titanium oxide serving as an intermediate is heated in the presence of a tin compound. Japanese Unexamined Patent Application Publication No. 2005-132706 discloses a method of producing rutile-type $Ti_xSn_{1-x}O_2$ nanoparticles including a reaction of a titanium compound and a tin compound at a pH in the range of −1 to 3.

In the method disclosed in Document 1, in order to produce titanium oxide nanoparticles having a particle diameter of 10 nm or less, it is necessary to set the concentration of the starting material to a low value, and it takes several days to conduct the reaction. Consequently, the production cost is increased. Furthermore, the method disclosed in Document 1 provides not rutile-type but only anatase-type titanium oxide nanoparticles. Document 2 does not disclose a liquid-phase synthesis of rutile-type titanium oxide nanoparticles which have a particle diameter of 10 nm or less, the surfaces of which are coated with a surfactant, and which are stably dispersed in an organic solvent.

In the production process disclosed in Japanese Examined Patent Application Publication No. 4-27168, an autoclave is necessary for the hydrothermal treatment, thereby increasing the production cost. In the technique disclosed in Japanese Patent No. 2783417, in order to achieve an excellent dispersion stability of particles, heating of the particles together with a silicon compound is performed. However, since the refractive index of the silicon compound is not high, the refractive index of $Ti_xSn_{1-x}O_2$ nanoparticles is disadvantageously decreased as a whole. In the technique disclosed in Japanese Unexamined Patent Application Publication No. 2005-132706, although the diameter of resulting primary particles is 10 nm or less, as a result of agglomeration of the primary particles, the entire particle diameter exceeds 10 nm.

SUMMARY

It is desirable to provide metal oxide nanoparticles that have a rutile-type crystal structure and that can be stably dispersed in an organic solvent, a liquid-phase synthesis method of producing the metal oxide nanoparticles with high productivity, and a light-emitting element assembly and an optical material including the metal oxide nanoparticles.

A method of producing metal oxide nanoparticles according to a first embodiment includes the steps of (A) mixing a first metal alkoxide containing a first metal, a second metal alkoxide containing a second metal different from the first metal, and a surfactant under an inert atmosphere to prepare a reaction solution; and (B) mixing a reaction initiator prepared by mixing a catalyst with a solvent and the reaction solution, and then heating the mixture of the reaction initiator and the reaction solution under an inert atmosphere to produce metal oxide nanoparticles which have a rutile-type crystal structure based on an atom of the first metal, an atom of the second metal, and an oxygen atom, and the surfaces of which are coated with the surfactant.

Preferably, the method of producing metal oxide nanoparticles according to the embodiment further includes the step of separating and washing the prepared metal oxide nanoparticles after step (B).

Metal oxide nanoparticles according to a first embodiment have a rutile-type crystal structure based on an atom of a first metal, an atom of a second metal different from the first metal, and an oxygen atom, wherein the surfaces of the metal oxide nanoparticles are coated with a surfactant.

Metal oxide nanoparticles according to a second embodiment are produced by the steps of (A) mixing a first metal alkoxide containing a first metal, a second metal alkoxide containing a second metal different from the first metal, and a surfactant under an inert atmosphere to prepare a reaction solution; (B) mixing a reaction initiator prepared by mixing a catalyst with a solvent and the reaction solution, and then heating the mixture of the reaction initiator and the reaction solution under an inert atmosphere to produce metal oxide nanoparticles which have a rutile-type crystal structure based on an atom of the first metal, an atom of the second metal, and an oxygen atom, of which are coated with the surfactant; and (C) separating and washing the prepared metal oxide nanoparticles, wherein the surfaces of the metal oxide nanoparticles are coated with the surfactant.

A light-emitting element assembly according to a first embodiment includes (a) a light-emitting element, (b) a sealing member that seals the light-emitting element, and (c) a filling material filled in a space disposed between the light-emitting element and the sealing member, wherein the filling material is made of a nanoparticle-resin composite material in which the metal oxide nanoparticles according to the first embodiment or the second embodiment are dispersed in a polymer.

A light-emitting element assembly according to a second embodiment includes (a) a light-emitting element, and (b) a sealing member that seals the light-emitting element, wherein the sealing member is made of a nanoparticle-resin composite material in which the metal oxide nanoparticles according to the first embodiment or the second embodiment are dispersed in a polymer.

An optical material according to an embodiment is made of a nanoparticle-resin composite material in which the metal oxide nanoparticles according to the first embodiment or the second embodiment are dispersed in a polymer.

In the method of producing metal oxide nanoparticles according to the first embodiment including the above-described preferred embodiment, the metal oxide nanoparticles according to the first embodiment and the second embodiment, the light-emitting element assemblies according to the first embodiment and the second embodiment, and the optical material according to an embodiment, the first metal constituting the first metal alkoxide may be titanium (Ti) and the second metal constituting the second metal alkoxide may be tin (Sn). The metal oxide nanoparticles may further include at least one metal atom selected from zirconium (Zr), niobium (Nb), indium (In), cerium (Ce), hafnium (Hf), and tantalum (Ta). In such a case, a metal alkoxide containing the metal (a zirconium alkoxide, a niobium alkoxide, an indium alkoxide, a cerium alkoxide, a hafnium alkoxide, or a tantalum alkoxide) may be added to the reaction solution.

In the above-described preferred embodiments, each of the first metal alkoxide and the second metal alkoxide preferably includes at least one alkoxy group containing a linear or branched alkyl chain having 1 to 18 carbon atoms. The particle diameter of the metal oxide nanoparticles can be controlled by appropriately selecting the type of alkoxy group in the first metal alkoxide and the second metal alkoxide. Examples of the alkoxy group include a methoxy group, an ethoxy group, a n-propoxy group, an isopropoxy group, a n-butoxy group, an isobutoxy group, a sec-butoxy group, a tert-butoxy group, a n-pentyloxy group, a n-hexyloxy group, a n-heptyloxy group, a n-octyloxy group, an isooctyloxy group, a 2-ethylhexyloxy group, a n-nonyloxy group, a n-decyloxy group, a n-undecyloxy group, a n-dodecyloxy group, a n-tetradecyloxy group, a n-hexadecyloxy group, and a n-octadecyloxy group.

Furthermore, in the above-described preferred embodiments, the surfactant (also referred to as a dispersant) is a compound selected from carboxylic acids, phosphinic acids, phosphonic acids, sulfinic acids, sulfonic acids, thiols, and amines. In addition, the selected compound may include a linear or branched alkyl chain having 6 to 30 carbon atoms, an aryl group, an aryloxy group, or an olefin chain. The term "olefin chain" represents a hydrocarbon group containing at least one double bond. The alkoxy groups of the first metal alkoxide and the second metal alkoxide are modified with the surfactant in the reaction solution. In step (B), the first metal alkoxide and the second metal alkoxide are simultaneously hydrolyzed and condensed by dehydration at an optimum rate in the presence of the surfactant, thus preparing metal oxide nanoparticles, the surfaces of which are coated with the surfactant. By appropriately selecting the surfactant, the hydrolyzability of the alkoxy groups can be controlled and the reaction time in step (B) can be reduced. Furthermore, the growth process of the metal oxide nanoparticles can be controlled, and the particle diameter of the final metal oxide nanoparticles can be reduced. Specific examples of the surfactant include hexanoic acid, octanoic acid, decanoic acid, dodecanoic acid, hexadecanoic acid, octadecanoic acid (stearic acid), oleic acid, linoleic acid, benzoic acid, acetylbenzoic acid, diphenyl-4-benzoic acid, phenylacetic acid, diphenylacetic acid, methylbenzoic acid, butylbenzoic acid, phenoxyacetic acid, phenoxybenzoic acid, phenylbutyric acid, diphenylphosphinic acid, phenylphosphonic acid, benzenesulfonic acid, dodecylbenzenesulfonic acid, decanethiol, dodecanethiol, and octadecanethiol. These organic compounds may be used in combinations of two or more compounds in any mixing ratio according to a polymer used. Among the above-described surfactants, carboxylic acids, phosphinic acids, phosphonic acids, sulfinic acids, and sulfonic acids form ionic bonds with the surfaces of the metal oxide nanoparticles, and thiols form covalent bonds with the surfaces of the metal oxide nanoparticles. Alternatively, an organic compound having a functional group that forms covalent bonds or ionic bonds with the surfaces of the metal oxide nanoparticles or a functional group that forms coordinate bonds or hydrogen bonds with the surfaces of the metal oxide nanoparticles, having an organic group exhibiting an affinity with a polymer, and having a molecular weight of $1 \times 10^3$ or less is preferably selected as the surfactant. When the molecular weight of the surfactant exceeds $1 \times 10^3$, since the ratio of the organic substance including the polymer is relatively increased, the volume filling rate of the metal oxide nanoparticles in the nanoparticle-resin composite material is not satisfactorily increased. As a result, the refractive index of the nanoparticle-resin composite material is not controlled to a desired value is some cases. Herein, the molecular weight of the surfactant represents a molecular weight of a relative value in terms of polystyrene measured by gel permeation chromatography (GPC).

In the above-described preferred embodiments, the catalyst may be a base catalyst composed of an amine or an amine oxide containing a linear or branched alkyl chain having 1 to 18 carbon atoms or at least one acid catalyst selected from hydrochloric acid, nitric acid, sulfuric acid, acetic acid, oxalic acid, and phosphoric acid. The molar ratio of [catalyst/total of first metal alkoxide and second metal alkoxide] is preferably $1\times10^2$ or less, more preferably in the range of $1\times10^{-1}$ to $5\times10^1$, and particularly preferably in the range of $1\times10^0$ to $1\times10^1$. An example of the solvent constituting the reaction initiator (solvent to be mixed with the catalyst) is water. An alcohol may also be used instead of water. That is, it is important that the solvent constituting the reaction initiator have a hydroxyl group. Preferred examples of the alcohol include ethylene glycol, propylene glycol, triethylene glycol, tetraethylene glycol, polyethylene glycol, and polypropylene glycol. The molar ratio of [solvent constituting reaction initiator/total of first metal alkoxide and second metal alkoxide] is preferably in the range of $5\times100$ to $5\times10^2$, more preferably in the range of $1\times10^1$ to $3\times10^2$, and particularly preferably in the range of $2\times10^1$ to $1\times10^2$. When the molar ratio of [solvent constituting reaction initiator/total of first metal alkoxide and second metal alkoxide] is out of the range of $5\times10^0$ to $5\times10^2$, the yield may be decreased, resulting in a decrease in productivity.

The molar ratio of [total of first metal alkoxide and second metal alkoxide/surfactant] in the reaction solution is preferably in the range of $1\times10^{-2}$ to $1\times10^2$, more preferably in the range of $1\times10^{-4}$ to $1\times10^1$, and particularly preferably in the range of $1\times10^{-3}$ to $1\times10^0$. When the molar ratio of [total of first metal alkoxide and second metal alkoxide/surfactant] in the reaction solution is out of this range, the particle diameter of the final metal oxide nanoparticles may exceed $1\times10^{-8}$ m, or the dispersibility may be degraded.

In the above-described preferred embodiments, in step (A), a complexing agent may be mixed to prepare the reaction solution. In this case, the complexing agent may be a β-diketone. Examples of the β-diketone include acetylacetone, ethyl acetoacetate, and benzoylacetone. The complexing agent modifies alkoxy groups of the first metal alkoxide and the second metal alkoxide. Thereby, the particle diameter of the metal oxide nanoparticles can be controlled, and the value of the aspect ratio of the metal oxide nanoparticles represented by [length of major axis/length of minor axis] can be increased compared with the case where a complexing agent is not used. The molar ratio of [total of first metal alkoxide and second metal alkoxide/complexing agent] is preferably 0.2 or more, more preferably in the range of 0.2 to 100, and most preferably in the range of 0.2 to 10. When the molar ratio of [total of first metal alkoxide and second metal alkoxide/complexing agent] is less than 0.2, the modified alkoxy groups of the first metal alkoxide and the second metal alkoxide are not satisfactorily reacted, resulting in a decrease in the yield and a decrease in productivity.

In step (A), at least the first metal alkoxide, the second metal alkoxide, and the surfactant are mixed to prepare a homogeneous reaction solution. When a homogeneous reaction solution is not easily prepared, the reaction solution may be heated. The surfactant (or a mixture of a surfactant and an organic solvent described below) is preferably used after deaeration (for example, after deaeration by freeze-drying or after deaeration by heat-drying under a reduced pressure). Accordingly, hydrolysis and condensation by dehydration of the first metal alkoxide and the second metal alkoxide in the reaction solution can be prevented. A specific example of the method of mixing in step (A) is stirring with a magnetic stirrer or a mechanical stirrer at a temperature in the range of 10° C. to 200° C. and preferably in the range of 20° C. to 120° C. Examples of the inert atmosphere in step (A) include a nitrogen gas atmosphere and an argon gas atmosphere.

In step (B), after the reaction solution and the reaction initiator are mixed, the mixed solution is heated under stirring. The stirring can be performed with, for example, a magnetic stirrer or a mechanical stirrer. The heating may be performed with, for example, an oil bath or a mantle heater. Accordingly, the first metal alkoxide and the second metal alkoxide are simultaneously hydrolyzed and condensed by dehydration at an optimum rate to produce metal oxide nanoparticles. The heating temperature (reaction temperature) is preferably in the range of 50° C. to 200° C. and more preferably in the range of 70° C. to 120° C. When the heating temperature is lower than 50° C., alkoxy groups of the first metal alkoxide and the second metal alkoxide are not satisfactorily reacted, resulting in a decrease in the yield and a decrease in productivity. The reaction time (the time required for producing the metal oxide nanoparticles) in step (B) depends on the type of surfactant used and the concentrations of the starting materials, but the reaction time is about several tens of minutes to 24 hours. At the time of completion of step (B), the heating temperature may be lower than 50° C. Examples of the inert atmosphere in step (B) include a nitrogen gas atmosphere and an argon gas atmosphere. The surfaces of the resulting metal oxide nanoparticles are coated with the surfactant, and the metal oxide nanoparticles are soluble in nonpolar solvents such as toluene and hexane.

When a step of separating and washing the resulting metal oxide nanoparticles [step (C)] is performed after the completion of step (B), a polar solvent (e.g., ethanol) is added to the solution obtained at the completion of step (B). In order to reduce the time required for the separation, the solution may be concentrated in advance, and the polar solvent may then be added. Accordingly, the resulting metal oxide nanoparticles can be precipitated without causing a permanent agglomeration. Subsequently, the precipitated metal oxide nanoparticles may be separated by centrifugal separation, suction filtration, or the like. Furthermore, the separated metal oxide nanoparticles may then be washed with a polar solvent (e.g., ethanol) a plurality of times. Alternatively, in a washing method, steps of dissolving the separated metal oxide nanoparticles in a nonpolar solvent (e.g., toluene), adding a polar solvent (e.g., ethanol) to the solution, and again separating the metal oxide nanoparticles by centrifugal separation, suction filtration, or the like may be repeated a plurality of times. In addition, in the step of washing, a size-selective precipitation (precipitation for classification) may be performed.

Furthermore, in the above-described preferred embodiments, in step (A), the final metal oxide nanoparticles having a satisfactorily small desired diameter can be produced without using an organic solvent. Therefore, the use of an organic solvent is not essential. However, in order to control the particle diameter of the final metal oxide nanoparticles, in step (A), in addition to the first metal alkoxide, the second metal alkoxide, and the surfactant, an organic solvent may be mixed under an inert atmosphere to prepare a reaction solution. In such a case, the organic solvent preferably includes a linear or branched alkyl chain having 7 to 18 carbon atoms or an aryl group, has compatibility with the first metal alkoxide, the second metal alkoxide, and the surfactant, and is nonreactive to the first metal alkoxide, the second metal alkoxide, and the surfactant. Examples of the organic solvent include n-heptane, n-octane, isooctane, n-nonane, n-decane, n-dodecane, n-hexadecane, n-heptadecane, n-octadecane, 1-octadecene, toluene, dioctyl ether, and diphenyl ether. The phrase "the organic solvent has compatibility with the metal alkoxide" or "the organic solvent has compatibility with the surfactant" means that these are homogeneously mixed without phase separation. The phrase "the organic solvent is nonreactive to the metal alkoxide" means that the organic solvent neither decomposes the metal alkoxide nor causes denaturation such as chemical modification. The phrase "the organic solvent is nonreactive to the surfactant" means that the organic solvent neither decomposes the surfactant nor causes denaturation such as chemical modification.

The metal oxide nanoparticles produced by the above steps have a particle diameter of $1 \times 10^{-8}$ m (preferably 10 nm) or less, a rutile-type crystal structure, and excellent crystallinity, the surfaces of which are coated with the surfactant, and are stably dispersed in a nonpolar solvent (e.g., toluene) serving as an organic solvent for dispersion. That is, preferably, the diameter of all the particles is 10 nm or less, and the metal oxide nanoparticles are in a dispersion state (i.e., form a group of metal oxide nanoparticles) without being agglomerated. The prepared metal oxide nanoparticles can be stably dispersed in a polymer having affinity with the surfactant, for example, to the extent of about 40% of volume filling rate. As described above, by combining the polymer, a nanoparticle-resin composite material that has a high refractive index (for example, 1.55 or more) and that is transparent in the visible light region can be produced.

As described above, in the present application, the particle diameter (D) of metal oxide nanoparticles is preferably $1 \times 10^{-8}$ m or less, more preferably in the range of $2 \times 10^{-9}$ m to $1 \times 10^{-8}$ m, and further preferably in the range of $2 \times 10^{-9}$ m to $1.0 \times 10^{-8}$ m. The particle diameter of a metal oxide nanoparticle can be determined by measuring the particle diameter of the metal oxide nanoparticle observed with a transmission electron microscope (TEM). When the shape (planar shape) of a metal oxide nanoparticle observed with a transmission electron microscope is not a round shape, a circle having the same area as that of the observed metal oxide nanoparticle is assumed, and the diameter of the circle may be defined as the particle diameter. Examples of the shape (three-dimensional shape) of a particle in the case where the three-dimensional shape of a metal oxide nanoparticle is not spherical include a rod shape, a spheroid, and a rectangular parallelepiped. The particle diameter of metal oxide nanoparticles in a nanoparticle-resin composite material can be determined by, for example, preparing a thin section with a microtome, and observing the thin section with a transmission electron microscope. The phrase "the upper limit of the particle diameter (D) of the metal oxide nanoparticles is $1 \times 10^{-8}$ m and preferably $1.0 \times 10^{-8}$ m" as described above means that the relationship represented by $D_{ave}+2\sigma \leq 1 \times 10^{-8}$ m or $D_{ave}+2\sigma \leq 1.0 \times 10^{-8}$ m is satisfied wherein $D_{ave}$ represents the average particle diameter of the metal oxide nanoparticles and $\sigma$ represents the standard deviation. By specifying the particle diameter (D) of the metal oxide nanoparticles to $1 \times 10^{-8}$ m or less, a decrease in light transmittance of the nanoparticle-resin composite material and a loss of light that are caused by Rayleigh scattering can be suppressed. Accordingly, a nanoparticle-resin composite material that is transparent in the visible light region can be produced in view of practical use. The light transmittance exponentially decreases as the optical path length increases. Therefore, as described below, as the optical path length increases, metal oxide nanoparticles having a smaller diameter are preferably used. When agglomerates of metal oxide nanoparticles are formed in a nanoparticle-resin composite material, the size of the agglomerates acts as the effective particle diameter. Therefore, in order to suppress Rayleigh scattering, it is important that the metal oxide nanoparticles be filled in a state in which the metal oxide nanoparticles are dispersed so as not to form agglomerates.

According to the present application, 10% or more of the sites occupied by atoms of the first metal in the metal oxide nanoparticles is preferably replaced with atoms of the second metal. More preferably, 10% to 99%, particularly preferably 10% to 80%, and still more preferably 10% to 60% of the sites occupied by atoms of the first metal is replaced with atoms of the second metal. That is, the metal oxide nanoparticles form a solid solution. For example, the atoms of the first metal may be titanium atoms and the atoms of the second metal may be tin atoms. More specifically, in rutile-type $Ti_xSn_{1-x}O_2$ nanoparticles, x preferably satisfies the relationship of $0.1 \leq x \leq 0.99$, more preferably $0.1 \leq x \leq 0.8$, and still more preferably $0.1 \leq x \leq 0.6$. When x is less than 0.1, final $Ti_xSn_{1-x}O_2$ nanoparticles may contain anatase-type nanoparticles.

Examples of a light-emitting element in the light-emitting element assembly according to an embodiment include a light-emitting diode (LED) and a laser diode. When the light-emitting element is a light-emitting diode, examples of the light-emitting diode include a red-light-emitting diode that emits red light (for example, having a wavelength of 640 nm), a green-light-emitting diode that emits green light (for example, having a wavelength of 530 nm), a blue-light-emitting diode that emits blue light (for example, having a wavelength of 450 nm), and a white-light-emitting diode (a light-emitting diode that emits white light by combining, for example, an ultraviolet or blue light-emitting diode and phosphor particles). The light-emitting diode may have a face-up structure or a flip-chip structure. That is, the light-emitting diode may include a substrate and a luminescent layer provided on the substrate. The light-emitting diode may have a structure in which light is emitted from the luminescent layer to the exterior of the light-emitting diode or a structure in which light emitted from the luminescent layer is emitted to the exterior of the light-emitting diode through the substrate. More specifically, for example, a light-emitting diode (LED) has a laminated structure including a first cladding layer that is provided on the substrate and that is composed of a compound semiconductor layer having a first conductivity type (for example, n type), an active layer provided on the first cladding layer, and a second cladding layer that is provided on the active layer and that is composed of a compound semiconductor layer having a second conductivity type (for example, p type). The light-emitting diode further includes a first electrode that is electrically connected to the first cladding layer and a second electrode that is electrically connected to the second cladding layer. The materials of the layers constituting the light-emitting diode may be selected from known compound semiconductor materials in accordance with the emission wavelength. In the light-emitting element assembly according to an embodiment, light emitted from the light-emitting element is transmitted through a filling material made of a nanoparticle-resin composite material and a sealing member and emitted to the exterior of the light-emitting element, or light emitted from the light-emitting element is transmitted through a sealing member made of a nanoparticle-resin composite material and emitted to the exterior of the light-emitting element.

In the light-emitting element assembly according to the first embodiment, from the standpoint that light reflection on the interface with the filling material is suppressed, the sealing member is preferably made of a material having a high refractive index. Examples of the material having a high refractive index include plastic materials having a high refractive index such as Prestige (trade name, refractive index: 1.74) produced by Seiko Optical Products Co., Ltd., ULTI- MAX V AS 1.74 (trade name, refractive index: 1.74) produced by Showa Optical Co., Ltd., and NL5-AS (trade name, refractive index: 1.74) produced by Nikon-Essilor Co., Ltd.; optical glasses such as glass members NBFD11 (refractive index n: 1.78), M-NBFD82 (refractive index n: 1.81), and M-LAF81 (refractive index n: 1.731) that are produced by HOYA Corporation; and inorganic dielectric materials such as $KTiOPO_4$ (refractive index n: 1.78) and lithium niobate [$LiNbO_3$] (refractive index n: 2.23).

Alternatively, in the light-emitting element assembly according to the first embodiment, specific examples of the material constituting the sealing member include epoxy resins, silicone resins, acrylic resins, polycarbonate resins, spiro-compounds, poly(methyl methacrylate), and copolymers thereof, diethylene glycol bis(allyl carbonate) (CR-39) and polymers of an urethane-modified monomer of mono (meth)acrylate of brominated bisphenol-A and copolymers thereof, polyester resins (e.g., polyethylene terephthalate resins and polyethylene naphthalate resins), unsaturated polyesters, acrylonitrile-styrene copolymers, vinyl chloride resins, polyurethane resins, and polyolefin resins. The sealing member may be made of at least one of these materials. Considering heat resistance, aramid resins can also be used. In this case, the upper limit of the heating temperature during formation of an antifouling layer made of a fluorocarbon resin, which is described below, is increased to 200° C. or higher, and thus the range of fluorocarbon resins that can be used as the antifouling layer can be increased.

The light-emitting element assembly according to the first embodiment or the second embodiment can be used in devices that involve light emission. Examples of such devices include backlights which include a planar light source device wherein two types of device including a direct-type backlight device and an edge-lighting-type backlight device (also referred to as side-lighting-type backlight device) are known of liquid crystal display devices; lighting devices and lamps in vehicles such as automobiles, electric trains, ships and vessels, and aircrafts (e.g., headlights, taillights, high-mount stop lights, small lights, turn signal lamps, fog lights, interior lights, lights for meter panels, light sources installed in various buttons, lights for destination screens, emergency lights, and emergency exit guide lamps); various lighting devices and lamps in buildings (e.g., outdoor lights, interior lights, lighting equipment, emergency lights, and emergency exit guide lamps); street lights; various display lighting devices in traffic signals, signboards, machines, and apparatuses; and lighting equipment and light collection parts in tunnels, underground passages, and the like.

Examples of optical products to which the optical material according to an embodiment can be applied include not only the above-described light-emitting element assembly but also porous oxide electrodes in photoelectric transducers, lens materials for optical lenses, Fresnel lenses, microlens arrays, and the like; and various optical thin-films such as light control films, antireflective coatings, and diffusion films. For example, a nanoparticle-resin composite material including metal oxide nanoparticles according to an embodiment made of niobium pentoxide and a polymer has an excellent environmental resistance in which a degradation of optical properties (such as transparency) caused by heat or light is suppressed. Furthermore, in this nanoparticle-resin composite material, an effect of suppressing a change in refractive index for temperature variations can be provided as an athermal property. Therefore, this nanoparticle-resin composite material can be used as a microlens array, a filling material and a sealing member of optical semiconductor devices such as light-emitting diodes, and a material for optical fibers, optical adhesive, and various optical thin-films.

The filling material in the light-emitting element assembly according to the first embodiment, the sealing member in the light-emitting element assembly according to the second embodiment, and the optical material according to an embodiment are composed of a nanoparticle-resin composite material in which metal oxide nanoparticles according to an embodiment that include the above-described various preferred embodiments and structures are dispersed in a polymer. The refractive index of the nanoparticle-resin composite material can be adjusted on the basis of the following principle. More specifically, the refractive index of a nanoparticle-resin composite material prepared by dispersing metal oxide nanoparticles with a high refractive index in a matrix (polymer) is theoretically described by Maxwell Garnet (see C. F. Bohren and D. R. Huffman, "Adsorption and Scattering of Light by Small Particles", John Wiley & Sons, New York, 1983, pp. 213). When the metal oxide nanoparticles are homogeneously dispersed in the polymer, the relative dielectric constant of the whole nanoparticle-resin composite material can be determined using equation (1):

$$\varepsilon_{av} = \varepsilon_m \left[ 1 + \frac{3\eta\left(\frac{\varepsilon_p - \varepsilon_m}{\varepsilon_p + 2\varepsilon_m}\right)}{1 - \eta\left(\frac{\varepsilon_p - \varepsilon_m}{\varepsilon_p + 2\varepsilon_m}\right)} \right] \quad (1)$$

$\varepsilon_{av}$: average relative dielectric constant (relative dielectric constant of whole nanoparticle-resin composite material)
$\varepsilon_p$: relative dielectric constant of spherical particles (metal oxide nanoparticles)
$\varepsilon_m$: relative dielectric constant of matrix (polymer)
$\eta$: volume filling rate of metal oxide nanoparticles Since refractive index n is represented by $n=\varepsilon^{1/2}$, the whole (average) refractive index of the nanoparticle-resin composite material can be determined using equation (1). For example, when rutile-type titanium oxide/tin nanoparticles having a refractive index of 2.7 are dispersed in a polymer having a refractive index of 1.5 and the volume filling rates $\eta$ of the metal oxide nanoparticles are 0.06 and 0.15, the whole (average) refractive indices of the nanoparticle-resin composite material are 1.56 and 1.65, respectively. Accordingly, the refractive index of the whole nanoparticle-resin composite material can be adjusted by changing the volume filling rate $\eta$ of the metal oxide nanoparticles incorporated in the nanoparticle-resin composite material. Therefore, the material of the metal oxide nanoparticles may be selected in advance in accordance with a target refractive index of the nanoparticle-resin composite material, and the volume filling rate $\eta$ may be further set. The volume filling rate $\eta$ of the metal oxide nanoparticles can be determined from the amount of residue (metal oxide nanoparticles) obtained after the nanoparticle-resin composite material is heated to burn out the organic component. The change in weight by heating can be measured by, for example, thermogravimetry (TG). The volume filling rate of the metal oxide nanoparticles in the final nanoparticle-resin composite material is preferably, for example, in the range of 0.01 to 0.4.

The light transmittance of a nanoparticle-resin composite material based on Rayleigh scattering in the case where particle diameter is sufficiently smaller than the wavelength of light can be determined using equations (2-1) and (2-2):

$$C_{sca} = \frac{8}{3}\left(\frac{2\pi n_m r}{\lambda}\right)^4 \cdot \left(\frac{\left(\frac{n_p}{n_m}\right)^2 - 1}{\left(\frac{n_p}{n_m}\right)^2 + 2}\right)^2 \cdot \pi r^2 \quad (2\text{-}1)$$

$$\alpha_{sca} = \frac{3}{4}\frac{\eta C_{sca}}{\pi r^3} \quad (2\text{-}2)$$

$C_{sca}$: scattering cross section (unit: nm$^2$)
$\alpha_{sca}$: quenching rate (unit: nm$^{-1}$)
$n_m$: refractive index of matrix (polymer)
$n_p$: refractive index of spherical particles (metal oxide nanoparticles)
r: radius (=$D_{ave}/2$) of spherical particles (metal oxide nanoparticles)
η: volume filling rate of metal oxide nanoparticles
λ: wavelength of light in air Accordingly, for example, when metal oxide nanoparticles having a refractive index of 2.5 are dispersed in a matrix (polymer) having a refractive index of 1.5 and the volume filling rate η is 0.15, in order that the nanoparticle-resin composite material is transparent in a part with a thickness t of 0.5 mm through which light passes, the particle diameter D of the metal oxide nanoparticles is preferably 6 nm or less. When metal oxide nanoparticles having a refractive index of 2.2 are used and dispersed in a matrix (polymer) having a refractive index of 1.5, and the volume filling rate η is 0.15, in order that the nanoparticle-resin composite material is transparent in a part with a thickness t of 0.5 mm through which light passes, the particle diameter D of the metal oxide nanoparticles is preferably 8 nm or less. Thus, preferably, the particle diameter D and the volume filling rate η of the metal oxide nanoparticles are appropriately selected so as to obtain a desired transparency on the basis of the refractive index of the matrix (polymer) used and the refractive index of the metal oxide nanoparticles used.

Examples of the polymer constituting the nanoparticle-resin composite material include epoxy resins, silicone resins, acrylic resins, polycarbonate resins, and spiro-compounds. In order to stabilize the dispersion of particles, an appropriate surfactant is preferably selected in accordance with the polymer used. That is, an appropriate surfactant is preferably selected in producing the metal oxide nanoparticles, but in some cases, a surface treatment (as a substitute for an appropriate surfactant) may be performed after the production of the metal oxide nanoparticles.

Preferably, the nanoparticle-resin composite material is transparent in the visible light region and has a refractive index of 1.55 or more. The metal oxide nanoparticles preferably have a refractive index of 1.9 or more in the visible light region. Herein, more specifically, the term "refractive index of the metal oxide nanoparticles" means the refractive index of the bulk of the material constituting the metal oxide nanoparticles. Refractive indices of various materials such as the refractive index of the metal oxide nanoparticles (more specifically, the refractive index of the bulk of the material constituting the metal oxide nanoparticles), the refractive index of the nanoparticle-resin composite material, and the refractive index of the polymer can be measured with an Abbe refractometer or a V-block refractometer. The term "visible light region" means a range of light having a wavelength in the range of 380 to 750 nm. The term "transparent" or the state in which "the metal oxide nanoparticles are not agglomerated in the polymer" or "the metal oxide nanoparticles are homogeneously dispersed in the polymer" means that the light transmittance measured at an optical path length of 0.5 mm and at a wavelength of 400 nm on the basis of a method of measuring a light transmittance described below is 80% or more.

In producing the nanoparticle-resin composite material, specifically, metal oxide nanoparticles coated with a surfactant can be mixed with a polymer by any one of the following two methods. Namely, in a first method, the metal oxide nanoparticles are dispersed in a solvent that also dissolves the polymer, the polymer is then added and mixed under stirring, and only the organic solvent is removed by heating in a vacuum. In this case, the polymer is hardly vaporized because of its low vapor pressure. In a second method, a dry powder of the metal oxide nanoparticles is directly mixed with the polymer, and the mixture is homogeneously mixed with a known kneader.

In order to maintain heat resistance and light resistance, the nanoparticle-resin composite material may contain a known antioxidant or a light stabilizer.

In the light-emitting element assembly according to an embodiment, an antifouling layer made of a fluorocarbon resin may be provided on the surface of the sealing member. The thickness of the antifouling layer is not particularly limited, but is preferably in the range of $5 \times 10^{-10}$ to $5 \times 10^{-8}$ m, and more preferably in the range of $1 \times 10^{-9}$ to $2 \times 10^{-8}$ m from the viewpoint of transparency.

The fluorocarbon resin constituting the antifouling layer fundamentally contains a perfluoropolyether group and preferably an alkoxy silano group. The molecular structure of the fluorocarbon resin is not primarily limited as long as the fluorocarbon resin has a perfluoropolyether group. However, in reality, there is a limitation based on the requirement for a certain degree of ease of synthesis, i.e., realizability. More specifically, examples of the fluorocarbon resin constituting the antifouling layer include perfluoropolyether-group-containing alkoxysilane compounds represented by general formula (A):

$$R_f\{COR^1\text{—}R^2\text{—}Si(OR^3)_3\}_j \quad (A)$$

wherein $R_f$ represents a perfluoropolyether group, $R^1$ represents a divalent atom or group, $R^2$ represents an alkylene group or a phenylene group, $R^3$ represents an alkyl group, and j represents 1 or 2.

The molecular weight of the alkoxysilane compounds represented by general formula (A) is not particularly limited. However, in view of stability, ease of handling, and the like, the number-average molecular weight of the alkoxysilane compounds is in the range of $4 \times 10^2$ to $1 \times 10^4$ and preferably in the range of $5 \times 10^2$ to $4 \times 10^3$.

The perfluoropolyether group $R_f$ is a monovalent or divalent perfluoropolyether group. Specific structures of such perfluoropolyether groups are shown below, but are not limited thereto. In structural formulae (B), (C), (D), and (E), p and q are preferably in the range of 1 to 50 and each of n, l, m, and k represents an integer of 1 or more. The value m/l is preferably in the range of 0.5 to 2.0.

In j=2, an example of the perfluoropolyether group $R_f$ in general formula (A) is a group represented by structural formula (B):

$$\text{—CF}_2\text{—(OC}_2\text{F}_4)_p\text{—(OCF}_2)_q\text{—OCF}_2\text{—} \quad (B)$$

In j=1, examples of the perfluoropolyether group $R_f$ in general formula (A) include groups represented by structural formulae (C), (D) and (E). However, hydrogen atoms of all the alkyl groups need not be substituted with fluorine atoms, and hydrogen atoms may be partly contained.

$$F(CF_3CF_2CF_2)_n \quad \text{(C)}$$

$$CF_3(OCF(CF_3)CF_3)_m(OCF_2)_l \quad \text{(D)}$$

$$F-(CF(CF_3)CF_2)_k \quad \text{(E)}$$

Examples of the perfluoropolyether-group-containing material constituting the antifouling layer also include a perfluoropolyether having a polar group at a terminal (see Japanese Unexamined Patent Application Publication No. 9-127307), a composition for forming an antifouling film containing an alkoxysilane compound having a perfluoropolyether group having a specific structure (see Japanese Unexamined Patent Application Publication No. 9-255919), and surface modifiers produced by combining an perfluoropolyether-group-containing alkoxysilane compound with various materials (see Japanese Unexamined Patent Application Publication Nos. 9-326240, 10-26701, 10-120442, and 10-148701).

$R^1$ represents a divalent atom or group, and is a group for bonding $R^2$ and perfluoropolyether group $R_f$. $R^1$ is not particularly limited, but preferably an atom or an atomic group other than carbon, such as O, NH, or S, in view of synthesis. $R^2$ is a hydrocarbon group, and the number of carbons in $R^2$ is preferably in the range of 2 to 10. Specific examples of $R^2$ include alkylene groups such as a methylene group, an ethylene group, and a propylene group; and a phenylene group. $R^3$ is an alkyl group constituting an alkoxy group. Examples of $R^3$ generally includes alkyl groups each having 3 or less carbon atoms, namely, an isopropyl group, a propyl group, an ethyl group, and a methyl group. However, the number of carbons in $R^3$ may be 4 or more.

In order to form an antifouling layer, a fluorocarbon resin (for example, an alkoxysilane compound represented by general formula (A)) is generally diluted with a solvent for use. The solvent is not particularly limited, but is selected in consideration of the stability of the composition, the wettability to the surface of the sealing member, the volatility, and the like when the solvent is used. Specific examples thereof include alcohol solvents such as ethyl alcohol, ketone solvents such as acetone, and hydrocarbon solvents such as hexane. Furthermore, these solvents may be used alone or in a mixture of two or more solvents.

The solvent used for dissolving the fluorocarbon resin is selected in consideration of the stability of the composition, the wettability to the surface of the sealing member, the volatility, and the like when the solvent is used. For example, a fluorinated hydrocarbon solvent is used. The fluorinated hydrocarbon solvent is a compound obtained by substituting some of or all the hydrogen atoms of a hydrocarbon solvent, such as an aliphatic hydrocarbon, a cyclic hydrocarbon, or an ether with fluorine atoms. Examples thereof include ZEORORA-HXE (trade name, boiling point: 78° C.) produced by Zeon Corporation; perfluoroheptane (boiling point: 80° C.); perfluorooctane (boiling point: 102° C.); hydrofluoropolyethers such as H-GALDEN-ZV75 (boiling point: 75° C.), H-GALDEN-ZV85 (boiling point: 85° C.), H-GALDEN-ZV100 (boiling point: 95° C.), H-GALDEN-C (boiling point: 130° C.), and H-GALDEN-D (boiling point: 178° C.) and perfluoropolyethers such as SV-110 (boiling point: 110° C.) and SV-135 (boiling point: 135° C.) (trade names) that are produced by Ausimont, Inc.; and perfluoroalkanes, such as FC series, produced by Sumitomo 3M Limited. Among these fluorinated hydrocarbon solvents, in order to obtain an even antifouling layer having a uniform thickness, a solvent having a boiling point in the range of 70° C. to 240° C. is preferably selected as the solvent used for dissolving the fluorine compounds represented by general formula (A), in particular, hydrofluoropolyethers (HFPEs) or hydrofluorocarbons (HFCs) are preferably selected, and these solvents are preferably used alone or in a mixture of two or more solvents. When the boiling point is excessively low, for example, the application of the antifouling layer tends to be uneven. On the other hand, when the boiling point is excessively high, the antifouling layer is not readily dried and it tends to be difficult to form a uniform antifouling layer. HFPEs and HFCs have excellent solubility for the fluorine compounds represented by general formula (A) to provide an excellent coated surface.

A solution prepared by diluting a fluorocarbon resin (e.g., an alkoxysilane compound represented by general formula (A)) in a solvent is applied on the surface of the sealing member. Subsequently, for example, the sealing member is heated to volatilize the solvent and form a bond between the material of the sealing member and the fluorocarbon resin of the antifouling layer. Thus, the antifouling layer can be formed on the surface of the sealing member. Various methods used for general coating operations can be employed as the application method, but spin coating, spray coating, or the like can be preferably employed. Alternatively, in view of workability, the solution may be impregnated into paper, a cloth, or the like and may then be applied. The heating temperature is selected in consideration of heat resistance of the sealing member or the like. For example, when a polyethylene terephthalate resin is used for the sealing member, an appropriate heating temperature is in the range of 30° C. to 80° C.

Since the alkoxysilane compound represented by general formula (A) contains a fluorine compound in its molecule, the alkoxysilane compound has a water-repellent property and an improved antifouling property. Accordingly, characteristics such as abrasion resistance and antifouling property can be further imparted to the surface of the sealing member by forming the antifouling layer containing a perfluoropolyether-group-containing alkoxysilane compound represented by general formula (A).

In addition, as a catalyst for accelerating a reaction between the material of the sealing member and the material of the antifouling layer, at least one material selected from acids, bases, phosphoric esters, and acetylacetone is preferably added to the material of the antifouling layer. Specific examples of the catalyst include acids such as hydrochloric acid, bases such as ammonia, and phosphoric esters such as dilauryl phosphate. The amount of catalyst added is, for example, in the range of $1\times10^{-3}$ to 1 millimole/L. When an acid or a base is added, the addition of a carbonyl compound such as acetylacetone increases the reactivity. Therefore, a carbonyl compound is preferably added to the composition for forming the antifouling layer. The amount of carbonyl compound added is, for example, in the range of about $1\times10^{-1}$ to $1\times10^{2}$ millimole/L. By adding the catalyst, even when the heating (drying) temperature is decreased, a strong bond can be formed between the sealing member and the antifouling layer. This is advantageous in view of the production process, and the range of materials that can be used as the sealing member can be increased.

According to an embodiment, the surfaces of metal oxide nanoparticles are coated with a surfactant. Therefore, although the metal oxide nanoparticles have a small particle diameter of, for example, $1\times10^{-8}$ m or less, the metal oxide nanoparticles can be stably dispersed in an organic solvent. Furthermore, since the metal oxide nanoparticles can be homogeneously dispersed in a polymer without agglomeration, an excellent nanoparticle-resin composite material and an excellent optical material can be provided by combining the metal oxide nanoparticles with a polymer. Furthermore, the metal oxide nanoparticles have a high refractive index because of their rutile-type crystal structure. Accordingly, the refractive indices of the nanoparticle-resin composite material and the optical material can be further increased. According to the method of producing metal oxide nanoparticles according to an embodiment, a selection of an appropriate surfactant for controlling the growth of the metal oxide nanoparticles allows the diameter of the metal oxide nanoparticles to be reduced and can achieve a high yield. Furthermore, by combining a first metal alkoxide, a second metal alkoxide, and a surfactant, the dispersibility of the final metal oxide nanoparticles can be improved. In addition, since the first and second metal alkoxides having a high reactivity are capped with the surfactant, the reactivity of the first and second metal alkoxides can be reduced. Consequently, metal oxide nanoparticles having an extremely small particle diameter can be produced.

Additional features and advantages are described herein, and will be apparent from, the following Detailed Description and the figures.

DETAILED DESCRIPTION

Figure 1A:
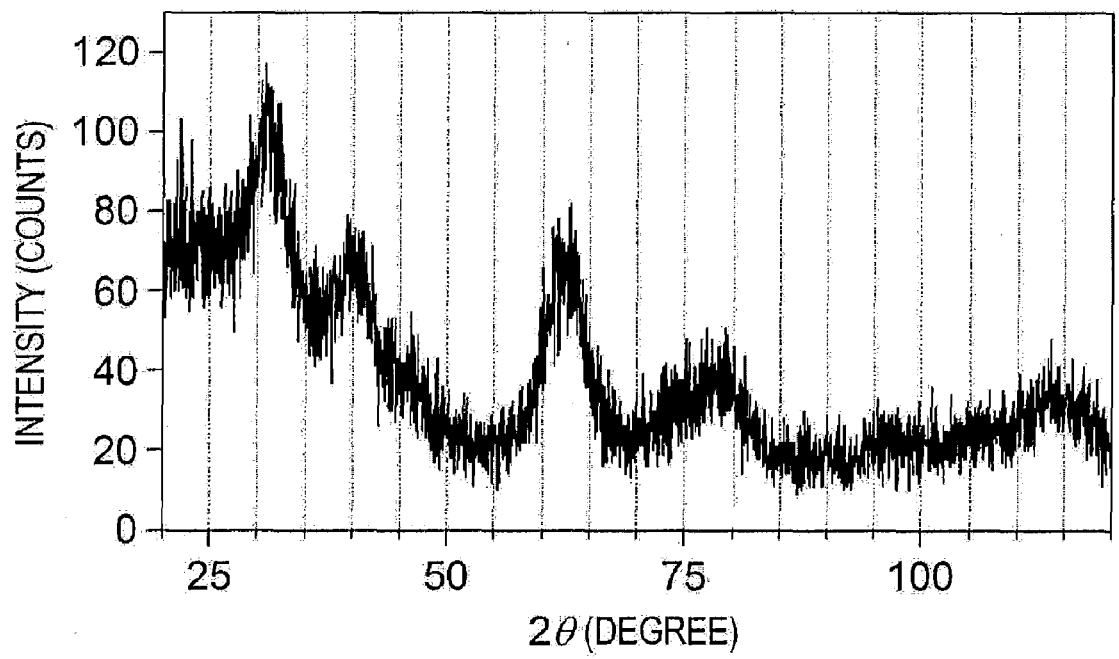
FIG. 1A is a powder X-ray diffraction spectrum (CoKα radiation) of the rutile-type $Ti_{0.5}Sn_{0.5}O_2$ nanoparticles of Example 1.

A detailed description is provided below according to embodiments.

EXAMPLE 1

Example 1 relates to the metal oxide nanoparticles according to the first embodiment and the second embodiment, and to the method of producing metal oxide nanoparticles according to the first embodiment.

Metal oxide nanoparticles of Example 1 have a rutile-type crystal structure based on an atom of a first metal (Ti in Example 1), an atom of a second metal (Sn in Example 1) different from the first metal, and an oxygen atom, and the surfaces of the metal oxide nanoparticles are coated with a surfactant.

Alternatively, metal oxide nanoparticles of Example 1 are produced by the steps of (A) mixing a first metal alkoxide containing a first metal (Ti in Example 1), a second metal alkoxide containing a second metal (Sn in Example 1) different from the first metal, and a surfactant under an inert atmosphere to prepare a reaction solution; (B) mixing a reaction initiator prepared by mixing a catalyst with a solvent and the reaction solution, and then heating the mixture of the reaction initiator and the reaction solution under an inert atmosphere to produce metal oxide nanoparticles which have a rutile-type crystal structure based on an atom of the first metal (Ti in Example 1), an atom of the second metal (Sn in Example 1), and an oxygen atom, and the surfaces of which are coated with the surfactant; and (C) separating and washing the prepared metal oxide nanoparticles, wherein the surfaces of the metal oxide nanoparticles are coated with the surfactant.

A method of producing metal oxide nanoparticles of Example 1 includes the steps of (A) mixing a first metal alkoxide containing a first metal (Ti in Example 1), a second metal alkoxide containing a second metal (Sn in Example 1) different from the first metal, and a surfactant under an inert atmosphere to prepare a reaction solution; and (B) mixing a reaction initiator prepared by mixing a catalyst with a solvent and the reaction solution, and then heating the mixture of the reaction initiator and the reaction solution under an inert atmosphere to produce metal oxide nanoparticles which have a rutile-type crystal structure based on an atom of the first metal (Ti in Example 1), an atom of the second metal (Sn in Example 1), and an oxygen atom, and the surfaces of which are coated with the surfactant.

More specifically, the rutile-type metal oxide nanoparticles in Example 1 are $Ti_xSn_{1-x}O_2$ nanoparticles (wherein X=0.5), and the particle diameter (D) of the nanoparticles is $1 \times 10^{-8}$ m or less. The method of producing the metal oxide nanoparticles of Example 1 will be described below. The following materials were used in the production.

First metal alkoxide: titanium tetraisopropoxide
Second metal alkoxide: tin tert-butoxide
Surfactant: oleic acid, which is a carboxylic acid containing an olefin chain
Catalyst: trimethylamine oxide
Solvent to be mixed with catalyst: water
Organic solvent: none

[Step-100]

First, the first metal alkoxide containing a first metal, the second metal alkoxide containing a second metal different from the first metal, and the surfactant were mixed under an inert atmosphere to prepare a reaction solution. More specifically, 2.5 mol of oleic acid serving as the surfactant was deaerated by heat-drying under a reduced pressure. Subsequently, 50 mmol of titanium tetraisopropoxide serving as the first metal alkoxide and 50 mmol of tin tert-butoxide serving as the second metal alkoxide were added to the mixture under a nitrogen gas atmosphere. The resulting solution was heated to 100° C. with an oil bath while being stirred and mixed with a magnetic stirrer under a nitrogen gas atmosphere to prepare a reaction solution. The molar ratio of [total of first metal alkoxide and second metal alkoxide/surfactant] in the reaction solution was $(50 \times 10^{-3} + 50 \times 10^{-3})/2.5 = 0.04$.

[Step-110]

Subsequently, a reaction initiator prepared by mixing the catalyst with the solvent, and the reaction solution were mixed. The mixture of the reaction initiator and the reaction solution was then heated under an inert atmosphere to produce metal oxide nanoparticles which contained atoms of the first metal and atoms of the second metal, which had a rutile-type crystal structure, and the surfaces of which were coated with the surfactant. More specifically, 200 mmol of trimethylamine oxide serving as the base catalyst was dissolved in 100 mL of water serving as the solvent (solvent constituting the reaction initiator) to prepare the reaction initiator. This reaction initiator and the reaction solution prepared in [Step-100] were then heated to 100° C. with an oil bath while being stirred and mixed with a magnetic stirrer under a nitrogen gas atmosphere to produce rutile-type $Ti_xSn_{1-x}O_2$ nanoparticles (wherein X=0.5). The reaction time was six hours. The molar ratio of [catalyst/total of first metal alkoxide and second metal alkoxide] was $(200\times10^{-3})/(50\times10^{-3}+50\times10^{-3})=2$, and the molar ratio of [solvent constituting reaction initiator/total of first metal alkoxide and second metal alkoxide] was $(100/18)/(50\times10^{-3}+50\times10^{-3})=56$.

[Step-120]

Subsequently, the prepared metal oxide nanoparticles were separated and washed. More specifically, the solution was cooled to 60° C., and an appropriate amount of ethanol was then added. The resulting rutile-type $Ti_{0.5}Sn_{0.5}O_2$ nanoparticles were separated by centrifugal separation. The separated rutile-type $Ti_{0.5}Sn_{0.5}O_2$ nanoparticles were washed with ethanol twice. A size-selective precipitation was not performed.

The prepared rutile-type $Ti_{0.5}Sn_{0.5}O_2$ nanoparticles were stably dispersed in toluene serving as an organic solvent for dispersion. No nondispersed agglomerated particles were observed. It was confirmed that oleic acid was adsorbed on the surfaces of the $Ti_{0.5}Sn_{0.5}O_2$ nanoparticles N by a spectrum obtained by Fourier transform infrared spectroscopy (FT-IR) of the $Ti_{0.5}Sn_{0.5}O_2$ nanoparticles. Thus, the rutile-type $Ti_{0.5}Sn_{0.5}O_2$ nanoparticles could be produced at a yield of 93%, i.e., 11 g, with high productivity.

According to a result of an elemental analysis of the prepared particles by electron probe microanalysis (EPMA), it was confirmed that the composition of the particles was $Ti_{0.5}Sn_{0.5}O_2$. Furthermore, as shown in FIG. 1A, the powder X-ray diffraction (XRD) spectrum of the particles showed that the particles had a rutile-type crystal structure.

Figure 2:
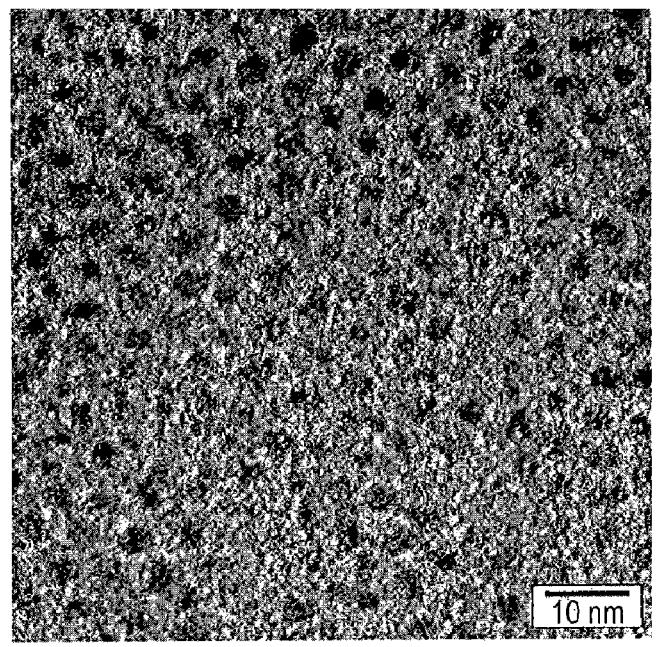
FIG. 2 is a transmission electron microscopy image of the rutile-type $Ti_{0.5}Sn_{0.5}O_2$ nanoparticles of Example 1.

FIG. 2 shows a transmission electron microscopy (TEM) image of the prepared rutile-type $Ti_{0.5}Sn_{0.5}O_2$ nanoparticles. The diameter of all the $Ti_{0.5}Sn_{0.5}O_2$ nanoparticles was 10 nm or less. More specifically, the $Ti_{0.5}Sn_{0.5}O_2$ nanoparticles had a particle diameter of 10 nm or less and an average particle diameter of 4 nm, and the nanoparticles were homogeneous (i.e., monodisperse particles). The expression "the particle diameter of metal oxide nanoparticles is D nm or less" means that when the average of the particle diameter of the metal oxide nanoparticles is represented by $D_{ave}$, and the standard deviation thereof is represented by σ, a value represented by $D_{ave}+2σ$ does not exceed D nm.

The rutile-type $Ti_{0.5}Sn_{0.5}O_2$ nanoparticles were homogeneously dispersed in methylphenylpolysiloxane ($n_D$=1.55) to prepare a nanoparticle-resin composite material that is transparent in the visible light region. The volume filling rate η of the $Ti_{0.5}Sn_{0.5}O_2$ nanoparticles was controlled to 10%.

The refractive index of the prepared nanoparticle-resin composite material was measured with a known Abbe refractometer (produced by ATAGO Co., Ltd., model number: NAR-4T). The measurement wavelength was the D-line. The light transmittance of the prepared nanoparticle-resin composite material was measured with a UV-visible spectrophotometer (produced by Hitachi High-Technologies Corporation, model number: U-3410) using a quartz cell with an optical path length of 0.5 mm in the wavelength range of 380 to 750 nm.

The refractive index of the nanoparticle-resin composite material measured with the D-line was 1.62. The nanoparticle-resin composite material had a light transmittance of 80% or more.

EXAMPLE 2

Example 2 is a modification of Example 1. In Example 2, $Ti_{0.5}Sn_{0.5}O_2$ nanoparticles were produced as in Example 1 except that the oleic acid serving as the surfactant was changed to hexanoic acid in the same step as [Step-100] of Example 1. In the same step as [Step-110] of Example 1, about one hour was sufficient for the formation of the $Ti_{0.5}Sn_{0.5}O_2$ nanoparticles. Consequently, $Ti_{0.5}Sn_{0.5}O_2$ nanoparticles having a particle diameter of 10 nm or less and excellent crystallinity could be produced at a yield of 97%, i.e., 11 g, with high productivity.

EXAMPLE 3

Example 3 is also a modification of Example 1. In Example 3, rutile-type $Ti_{0.8}Sn_{0.2}O_2$ nanoparticles were produced. A method of producing metal oxide nanoparticles of Example 3 will now be described.

[Step-300]

First, 2.5 mol of oleic acid serving as a surfactant was deaerated by heat-drying under a reduced pressure. Subsequently, 80 mmol of titanium tetraisopropoxide serving as a first metal alkoxide and 20 mmol of tin tert-butoxide serving as a second metal alkoxide were added to the mixture under a nitrogen gas atmosphere. The resulting solution was heated to 100° C. with an oil bath while being stirred and mixed with a magnetic stirrer under a nitrogen gas atmosphere to prepare a reaction solution. The molar ratio of [total of first metal alkoxide and second metal alkoxide/surfactant] in the reaction solution was $(80\times10^{-3}+20\times10^{-3})/2.5=0.04$.

[Step-310]

On the other hand, 200 mmol of trimethylamine oxide serving as a base catalyst was dissolved in 100 mL of water serving as a solvent (solvent constituting a reaction initiator) to prepare the reaction initiator. The reaction initiator and the reaction solution prepared in [Step-300] were then heated to 100° C. with an oil bath while being stirred and mixed with a magnetic stirrer under a nitrogen gas atmosphere to produce rutile-type $Ti_xSn_{1-x}O_2$ nanoparticles (wherein X=0.8). The reaction time was six hours. The molar ratio of [catalyst/total of first metal alkoxide and second metal alkoxide] was $(200\times10^{-3})/(80\times10^{-3}+20\times10^{-3})=2$, and the molar ratio of [solvent constituting reaction initiator/total of first metal alkoxide and second metal alkoxide] was $(100/18)/(80\times10^{-3}+20\times10^{-3})=56$.

[Step-320]

Subsequently, the prepared metal oxide nanoparticles were separated and washed. More specifically, the solution was cooled to 60° C., and an appropriate amount of ethanol was then added. The resulting rutile-type $Ti_{0.8}Sn_{0.2}O_2$ nanoparticles were separated by centrifugal separation. The separated rutile-type $Ti_{0.8}Sn_{0.2}O_2$ nanoparticles were washed with ethanol twice. A size-selective precipitation was not performed.

Figure 1B:
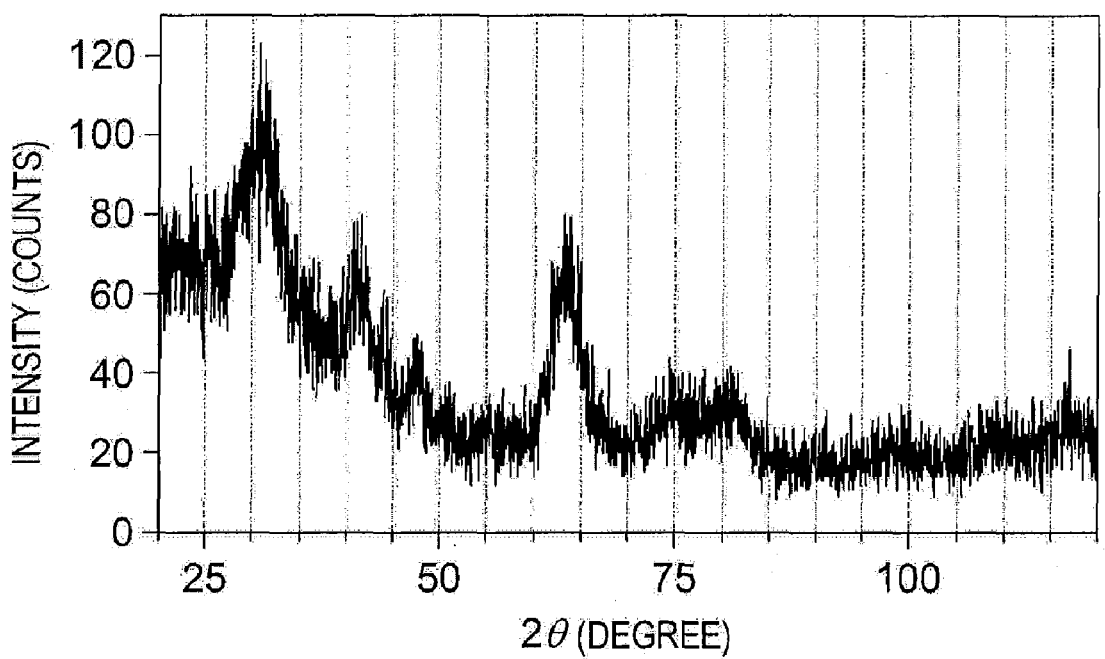
FIG. 1B is a powder X-ray diffraction spectrum (CoKα radiation) of the rutile-type $Ti_{0.8}Sn_{0.2}O_2$ nanoparticles of Example 3.

According to a result of an elemental analysis of the prepared particles by electron probe microanalysis (EPMA), it was confirmed that the composition of the particles was $Ti_{0.8}Sn_{0.2}O_2$ Furthermore, as shown in FIG. 1B, the powder X-ray diffraction (XRD) spectrum of the particles showed that the particles had a rutile-type crystal structure. The prepared rutile-type $Ti_{0.8}Sn_{0.2}O_2$ nanoparticles were stably dispersed in toluene serving as an organic solvent for dispersion. No nondispersed agglomerated particles were observed. It was confirmed that oleic acid was adsorbed on the surfaces of the $Ti_{0.8}Sn_{0.2}O_2$ nanoparticles N by a spectrum obtained by Fourier transform infrared spectroscopy of the $Ti_{0.8}Sn_{0.2}O_2$ nanoparticles. Thus, the rutile-type $Ti_{0.8}Sn_{0.2}O_2$ nanoparticles could be produced at a yield of 93%, i.e., 8.8 g, with high productivity.

Figure 3:
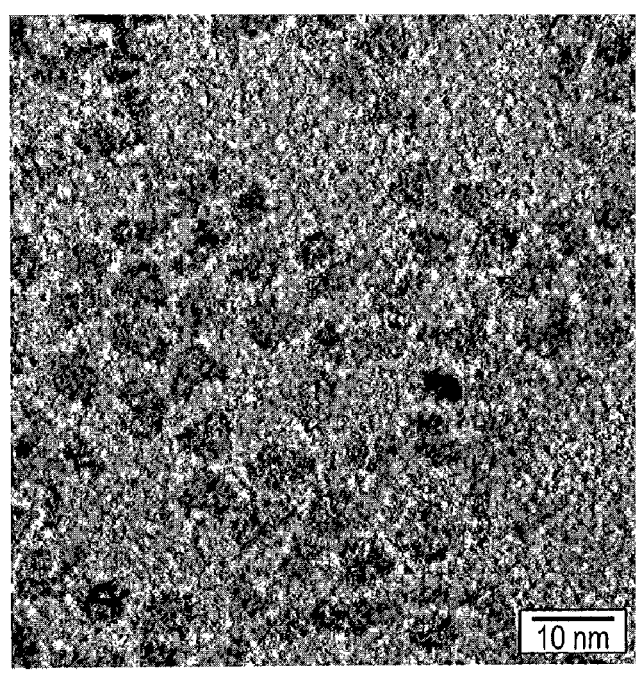
FIG. 3 is a transmission electron microscopy image of the rutile-type $Ti_{0.8}Sn_{0.2}O_2$ nanoparticles of Example 3.

FIG. 3 shows a transmission electron microscopy image of the prepared rutile-type $Ti_{0.8}Sn_{0.2}O_2$ nanoparticles. The diameter of all the $Ti_{0.8}Sn_{0.2}O_2$ nanoparticles was 10 nm or less. More specifically, the $Ti_{0.8}Sn_{0.2}O_2$ nanoparticles had a particle diameter of 10 nm or less, and the nanoparticles were homogeneous (i.e., monodisperse particles).

The rutile-type $Ti_{0.8}Sn_{0.2}O_2$ nanoparticles were homogeneously dispersed in methylphenylpolysiloxane ($n_D$=1.55) to prepare a nanoparticle-resin composite material that is transparent in the visible light region. The volume filling rate η of the $Ti_{0.8}Sn_{0.2}O_2$ nanoparticles was controlled to 10%. The refractive index of the prepared nanoparticle-resin composite material was 1.66. The nanoparticle-resin composite material had a light transmittance of 80% or more.

EXAMPLE 4

Example 4 is a modification of Example 3. In Example 4, $Ti_{0.8}Sn_{0.2}O_2$ nanoparticles were produced as in Example 3 except that the oleic acid serving as the surfactant was changed to hexanoic acid in the same step as [Step-300] of Example 3. In the same step as [Step-310] of Example 3, about one hour was sufficient for the formation of the $Ti_{0.8}Sn_{0.2}O_2$ nanoparticles. Consequently, $Ti_{0.8}Sn_{0.2}O_2$ nanoparticles having a particle diameter of 10 nm or less and excellent crystallinity could be produced at a yield of 97%, i.e., 9.1 g, with high productivity.

Comparative Example 1

Figure 6:
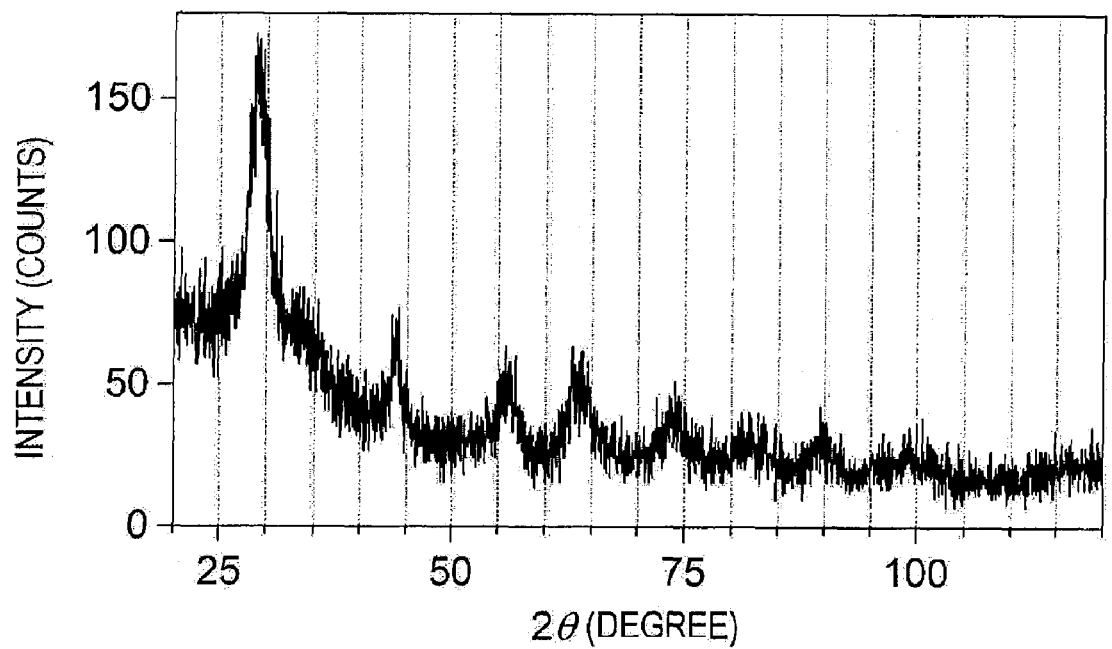
FIG. 6 is a powder X-ray diffraction spectrum (CoKα radiation) of the powder of Comparative Example 1.

In Comparative Example 1, the same steps as [Step-100] to [Step-120] of Example 1 were performed except for the following. In the same step as [Step-100] of Example 1, 100 mmol of titanium tetraisopropoxide was added as the first metal alkoxide, and no second metal alkoxide was added. The powder XRD spectrum (see FIG. 6) of the prepared particles showed that the particles had an anatase-type crystal structure. The refractive index of the particles was about 2.5, which was lower than that in Example 1.

Comparative Example 2

In Comparative Example 2, $Ti_{0.8}Sn_{0.2}O_2$ nanoparticles were synthesized as in Example 3, except that 900 mL of heptadecane was used without using oleic acid serving as the surfactant. As a result, only nondispersed, agglomerated, and amorphous $Ti_{0.8}Sn_{0.2}O_2$ nanoparticles were obtained.

EXAMPLE 5

Figure 4A:
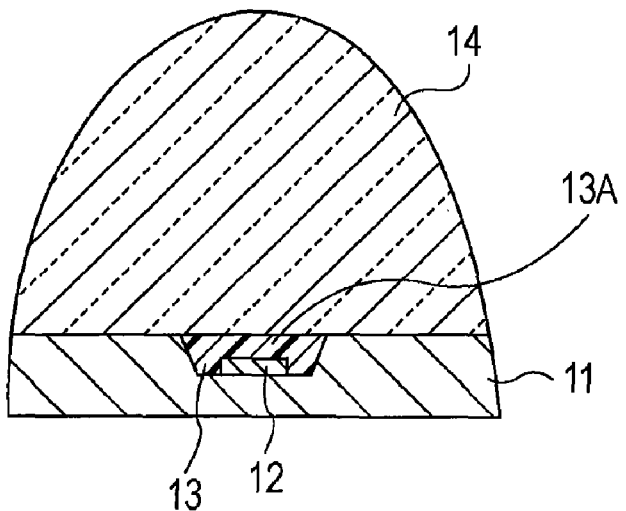
FIG. 4A is a schematic cross-sectional view of the light-emitting element assembly of Example 5.

Example 5 relates to a light-emitting element assembly according to the first embodiment and an optical material according to an embodiment. FIG. 4A is a schematic cross-sectional view of the light-emitting element assembly of Example 5. The light-emitting element assembly of Example 5 includes (a) a light-emitting element (light-emitting diode) 12, (b) a sealing member 14 that seals the light-emitting element 12, and (c) a filling material 13 filled in a space disposed between the light-emitting element 12 and the sealing member 14. The filling material (filling material for the light-emitting element assembly) or the optical material is composed of a nanoparticle-resin composite material 13A based on any one of Example 1 to Example 4.

More specifically, the light-emitting element assembly includes a reflective cup 11 having a recess (corresponding to the space), the light-emitting element 12 disposed in the recess of the reflective cup 11, the filling material 13 made of the nanoparticle-resin composite material 13A, and the sealing member 14 that has the shape of an artillery shell and that is made of a transparent material (for example, a polycarbonate resin having a refractive index of 1.6). The filling material 13 fills the recess of the reflective cup 11 so as to seal the light-emitting element 12. The sealing member 14 is disposed as a cap of the recess of the reflective cup 11 so as to seal the light-emitting element 12 and the nanoparticle-resin composite material 13A.

Thus, according to the light-emitting element assembly of Example 5, the transparent nanoparticle-resin composite material 13A having a high refractive index is used as the filling material (sealing material) 13. Accordingly, a phenomenon in which light emitted from the light-emitting element 12 is totally reflected on the interface between the light-emitting element 12 and the filling material 13 can be substantially prevented. Furthermore, a phenomenon in which light emitted from the light-emitting element 12 is totally reflected on the interface between the filling material 13 and the sealing member 14 can be substantially prevented. Consequently, the light extraction efficiency can be improved.

When the light-emitting element assembly of Example 5 is used as a light source in a planar light source device (backlight) of a liquid crystal display device, and light is emitted from the light-emitting diode serving as the light-emitting element only in the direction of the z-axis, unevenness of luminance may be generated in the planar light source device. In order to prevent such a phenomenon, a two-dimensional direction emitting structure may be used. According to this structure, a light-emitting diode assembly in which a light extraction lens serving as a sealing member is attached to a light-emitting diode is used as a light source, and light emitted from the light-emitting diode is totally reflected on the top face of the light extraction lens and emitted mainly in the horizontal direction of the light extraction lens.

Figure 4B:
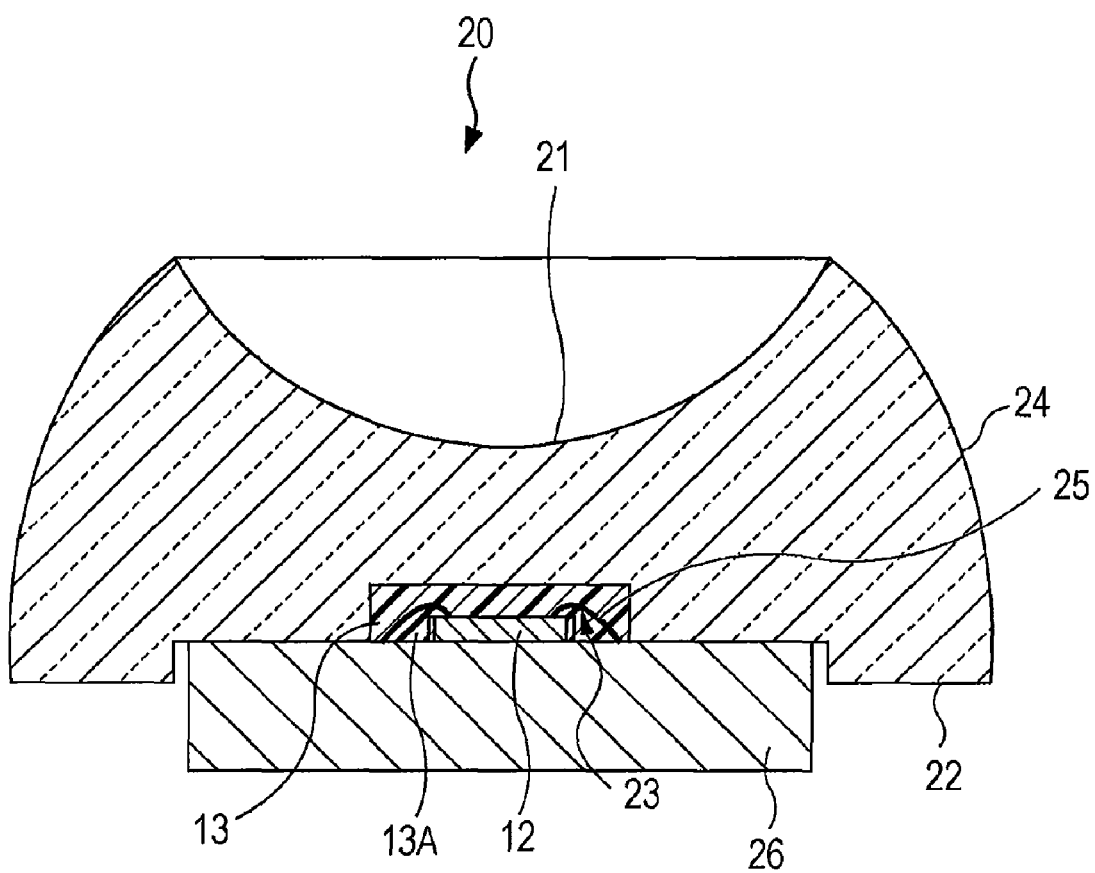
FIG. 4B is a schematic cross-sectional view of the light-emitting element assembly of Example 5 including a light extraction lens.

More specifically, a two-dimensional direction emitting structure shown in the schematic view of FIG. 4B may be used. In the two-dimensional direction emitting structure shown in FIG. 4B, a light-emitting element assembly in which a light extraction lens 20 is attached to a light-emitting element (light-emitting diode) 12 is used as a light source, and light emitted from the light-emitting element 12 is totally reflected on a part of the top face 21 of the light extraction lens 20 and emitted mainly in the horizontal direction of the light extraction lens 20. In FIG. 4B, the light extraction lens 20 includes a bottom face 22 and a side face 24. A recess (space) 23 is provided on the bottom face 22 of the light extraction lens 20, and the light-emitting element 12 is disposed in the recess 23. The recess 23 is filled with a filling material 13 made of a nanoparticle-resin composite material 13A. The light-emitting element assembly includes a substrate 26 and wiring 25 connecting the light-emitting element 12 to wiring portions (not shown) provided on the substrate 26. Examples of the material of the light extraction lens 20 include the above-described transparent material constituting the sealing member 14.

The light extraction lens 20 shown in FIG. 4B is a light extraction lens described in Japanese Patent Application No. 2005-300117, and includes the round bottom face 22, the side face 24, and the top face 21. The planar light source (light-emitting element 12) having a finite size is disposed at the center of the bottom face 22. When the center of the bottom face 22 is defined as the origin, and a cylindrical coordinate (r, φ, z) is assumed in which the normal line passing through the center of the bottom face 22 is the z-axis, the following is satisfied. The top face 21 is composed of an aspheric surface that is rotationally symmetric with respect to the z-axis.

Among semi- or total solid angle radiation emitted from the planar light source, some of the radiation components having a polar angle smaller than the polar angle $\theta_0$ at a part where the side face 24 intersects the top face 21 are totally reflected on the aspheric surface of the top face 21. The side face 24 is composed of an aspheric surface that is rotationally symmetric with respect to the z-axis. Among the semi- or total solid angle radiation emitted from the planar light source, radiation components having a polar angle larger than the polar angle $\theta_0$ and radiation components that are totally reflected on the top face 21 are transmitted through the aspheric surface of the side face 24. Furthermore, in a function $r=f_s(z)$ in which z that represents the side face 24 composed of the aspheric surface is a variable, the z coordinate at a part where the side face 24 intersects the top face 21 is represented by $z_1$. In this case, when z decreases in a closed interval of $0 \leq z \leq z_1$, the function $r=f_s(z)$ monotonically increases and has at least one point at which the absolute value $|d^2r/dz^2|$ of the second-order differential coefficient of z becomes a local maximum in the closed interval.

However, the light extraction lens is not limited to the light extraction lens 20 shown in FIG. 4B and may be a light extraction lens having any other configurations and structures.

In the light-emitting element assembly, an antifouling layer may be provided on the surface of the sealing member 14 or the light extraction lens 20.

More specifically, a composition for forming the antifouling layer was prepared as follows. Two parts by weight of an alkoxysilane compound having a perfluoropolyether group at each terminal (having an average molecular weight of about 4,000 and the following chemical formula) serving as a fluorocarbon resin was dissolved in 200 parts by weight of a hydrofluoropolyether, which is a fluorocarbon solvent with a boiling point of 130° C., (produced by Solvay Solexis, trade name: H-GALDEN). Furthermore, 0.08 parts by weight of a perfluoropolyether phosphate was added as a catalyst to prepare a homogeneous solution. The solution was then filtered with a membrane filter to prepare the composition for forming the antifouling layer. The composition for forming the antifouling layer was applied on the surface of the sealing member 14 with a spraying device and was then dried at 70° C. for one hour. Thus, a light-emitting element assembly in which the antifouling layer was formed on the surface of the sealing member 14 was produced.

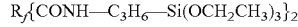

Corn starch was sprinkled on the sealing member 14 of the prepared light-emitting element assembly, and the corn starch was then removed with an air gun. The surface of the sealing member 14 was then observed with an optical microscope. According to the result of the observation, the corn starch was completely removed.

A light-emitting element assembly was produced as in the above-described assembly except that a resin (average molecular weight: about 2,000) having the following chemical formula was used as the fluorocarbon resin. Corn starch was sprinkled on the sealing member 14 of the light-emitting element assembly, and the corn starch was then removed with an air gun. The surface of the sealing member 14 was then observed with an optical microscope. According to the result of the observation, the corn starch was completely removed.

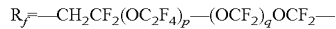

Furthermore, a light-emitting element assembly was produced as in the above-described assembly except that a resin (average molecular weight: about 650) having the following chemical formula was used as the fluorocarbon resin. Corn starch was sprinkled on the sealing member 14 of the light-emitting element assembly, and the corn starch was then removed with an air gun. The surface of the sealing member 14 was then observed with an optical microscope. According to the result of the observation, the corn starch was completely removed.

EXAMPLE 6

Figure 5:
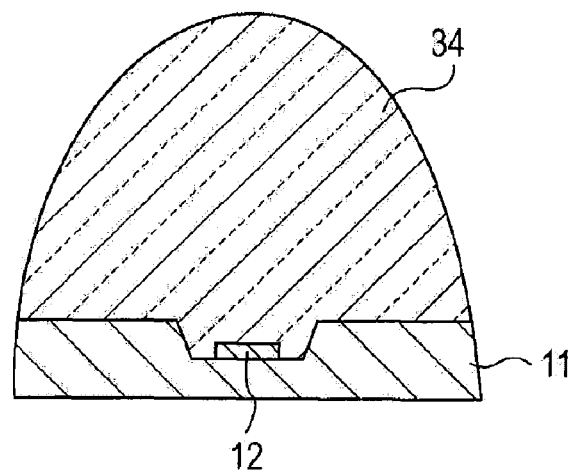
FIG. 5 is a schematic cross-sectional view of the light-emitting element assembly of Example 6.

Example 6 relates to a light-emitting element assembly according to the second embodiment and an optical material according to an embodiment. FIG. 5 is a schematic cross-sectional view of the light-emitting element assembly of Example 6. The light-emitting element assembly of Example 6 includes (a) a light-emitting element (light-emitting diode) 12 and (b) a sealing member 34 that seals the light-emitting element 12. The sealing member 34 or the optical material is composed of a nanoparticle-resin composite material 13A based on any one of Example 1 to Example 4.

More specifically, the light-emitting element assembly includes a reflective cup 11 having a recess (corresponding to a space), the light-emitting element 12 disposed in the recess of the reflective cup 11, and the sealing member 34 that is disposed so as to seal the light-emitting element 12.

Thus, according to the light-emitting element assembly of Example 6, the sealing member 34 is made of the transparent nanoparticle-resin composite material 13A having a high refractive index. Accordingly, a phenomenon in which light emitted from the light-emitting element 12 is totally reflected on the interface between the light-emitting element 12 and the sealing member 34 can be substantially prevented. Consequently, the light extraction efficiency can be improved.

Instead of the sealing member 34, the light-emitting element assembly may include the light extraction lens described in Example 5, which is made of the nanoparticle-resin composite material based on any one of Example 1 to Example 4. Furthermore, the antifouling layer described in Example 5 may be formed on the surface of the sealing member 34.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method of producing metal oxide nanoparticles comprising:
   mixing a first metal alkoxide containing a first metal, a second metal alkoxide containing a second metal different from the first metal, and a surfactant under an inert atmosphere to prepare a reaction solution;
   preparing a reaction initiator by mixing a catalyst with a solvent; and
   subsequently mixing the reaction initiator and the reaction solution, and then heating the mixture of the reaction initiator and the reaction solution under an inert atmosphere to produce metal oxide nanoparticles having diameters of $1 \times 10^{-8}$ m or less and which have a rutile-type crystal structure based on an atom of the first metal, an atom of the second metal, and an oxygen atom, and the surfaces of which are coated with the surfactant.

2. The method of producing metal oxide nanoparticles according to claim 1, further comprising:
separating and washing the prepared metal oxide nanoparticles.

3. The method of producing metal oxide nanoparticles according to claim 1,
wherein the first metal constituting the first metal alkoxide is titanium, and
the second metal constituting the second metal alkoxide is tin.

4. The method of producing metal oxide nanoparticles according to claim 1, wherein each of the first metal alkoxide and the second metal alkoxide includes at least one alkoxy group containing a linear or branched alkyl chain having 1 to 18 carbon atoms.

5. The method of producing metal oxide nanoparticles according to claim 1,
wherein the surfactant is a compound selected from the group consisting of carboxylic acids, phosphinic acids, phosphonic acids, sulfinic acids, sulfonic acids, thiols, and amines, and
the selected compound includes a linear or branched alkyl chain having 6 to 30 carbon atoms, an aryl group, an aryloxy group, or an olefin chain.

6. The method of producing metal oxide nanoparticles according to claim 1, wherein the catalyst is a base catalyst or an acid catalyst.

7. The method of producing metal oxide nanoparticles according to claim 1, wherein a complexing agent is mixed to prepare the reaction solution.

8. The method of producing metal oxide nanoparticles according to claim 7, wherein the complexing agent is a β-diketone.

9. The method of producing metal oxide nanoparticles according to claim 1, wherein 10% or more of the sites occupied by atoms of the first metal in the metal oxide nanoparticles are replaced with atoms of the second metal.

* * * * *